United States Patent

Nishimoto

(10) Patent No.: US 9,093,137 B2
(45) Date of Patent: Jul. 28, 2015

(54) SEMI-CONDUCTOR STORING APPARATUS

(71) Applicant: CASIO COMPUTER CO., LTD., Tokyo (JP)

(72) Inventor: Masateru Nishimoto, Tokyo (JP)

(73) Assignee: CASIO COMPUTER CO., LTD., Tokyo (JP)

( * ) Notice: Subject to any disclaimer, the term of this patent is extended or adjusted under 35 U.S.C. 154(b) by 84 days.

(21) Appl. No.: 14/158,495

(22) Filed: Jan. 17, 2014

(65) Prior Publication Data

US 2014/0241045 A1 Aug. 28, 2014

(30) Foreign Application Priority Data

Feb. 27, 2013 (JP) ................................. 2013-036968

(51) Int. Cl.
*G11C 11/00* (2006.01)
*G11C 7/22* (2006.01)
*G11C 8/10* (2006.01)
*G11C 11/418* (2006.01)
*G11C 19/08* (2006.01)

(52) U.S. Cl.
CPC .. *G11C 7/22* (2013.01); *G11C 8/10* (2013.01); *G11C 11/418* (2013.01); *G11C 19/0875* (2013.01)

(58) Field of Classification Search
USPC .............. 365/154, 189.05; 345/531
See application file for complete search history.

(56) References Cited

U.S. PATENT DOCUMENTS

| | | | |
|---|---|---|---|
| 2009/0244080 A1 | 10/2009 | Ishikura | |
| 2010/0103315 A1* | 4/2010 | Li et al. | 348/500 |
| 2011/0115803 A1* | 5/2011 | Ozaki | 345/531 |

FOREIGN PATENT DOCUMENTS

| | | |
|---|---|---|
| JP | H2-260300 A | 10/1990 |
| JP | H7-57492 A | 3/1995 |
| JP | 2007-102973 A | 4/2007 |
| JP | 2007-149201 A | 6/2007 |
| JP | 2009-246488 A | 10/2009 |

OTHER PUBLICATIONS

Japanese Office Action dated Jan. 13, 2015, in a counterpart Japanese patent application No. 2013-036968.

* cited by examiner

*Primary Examiner* — Vu Le
(74) *Attorney, Agent, or Firm* — Chen Yoshimura LLP

(57) ABSTRACT

A semi-conductor storing apparatus is provided, which comprises plural storing units, each having a line buffer including plural flip-flop circuits and a clock supplying circuit for supplying a clock to the plural flip-flop circuits, a clock-controlling unit, which controls on/off operation of the clock supplying circuit to decide whether to output a clock, a selecting unit, which selects one from among outputs from the plural storing units, and an unit-controlling unit, which controls the operations of the clock-controlling unit and the selecting unit.

5 Claims, 4 Drawing Sheets

SEMI-CONDUCTOR STORING APPARATUS

CROSS-REFERENCE TO RELATED APPLICATION

The present application is based upon and claims the benefit of priority from the prior Japanese Patent Application No. 2013-036968, filed Feb. 27, 2013, the entire contents of which are incorporated herein by reference.

FIELD OF THE INVENTION

The present invention relates to a semi-conductor storing apparatus, and more particularly, to a line buffer for temporarily storing data.

BACKGROUND OF THE INVENTION

In general, LSI (semi-conductor large-scale integrated circuit) for processing image data of digital cameras is equipped with an image processing circuit (data processing circuit) for processing entered image data.

In the image processing circuit, a line buffer is often used for holding one line of image data in the horizontal direction during raster scanning and when pixels in the vertical direction are used for data processing.

For instance, Japanese Unexamined Patent Publication No. 2009-246488 discloses a technique of a line buffer, which is provided with a single port memory for storing one line of image data, and is capable of performing a reading operation and a writing operation substantially at the same rate as the line buffer having the dual port memory.

Many of the line buffers are mounted with SRAM (Static Random Access Memory), but some of them are provided with flip-flop circuits from the standpoint of a circuit area in the case where a horizontal size of an image is short.

Generally, when the flip-flop circuits are mounted on the line buffer, the circuit configuration is broadly divided into an address system and FIFO (First-In First-Out) system.

FIG. 1 is a block diagram of the line buffer having 160 pixels on one line, implemented in the address system.

In the line buffer shown in FIG. 1, a reference numeral 11 denotes flip-flop circuits 11 for storing entered image data and prepared for 160 pixels.

Further, in the line buffer shown in FIG. 1, a reference numeral 12 denotes a write-address decoder for designating based on an entered write address, one of the flip-flop circuits 11, in which the image data is to be recorded, a reference numeral 13 denotes clock gating cells for controlling a clock supply to the flip-flop circuit designated by the write-address decoder 12, a reference numeral 14 denotes a read-address decoder for designating based on an entered read address, one of the flip-flop circuits 11 which records a pixel to be subjected to image processing, and a reference numeral 15 denotes a selector for selecting an output signal from the flip-flop circuit 11 designated by the read-address decoder 14.

In the line buffer of the address system, the flip-flop circuits 11 are assigned with addresses for storing 160 pieces of data, respectively, that is, the flip-flop circuits 11 are assigned with the addresses, for example, from 000 to 159 for storing 160 pieces of data beginning from the leading data.

In the case where the image data is recorded in the flip-flop circuit (FF000) having the address 000, when an address of 000 is designated as the write address, then the write-address decoder 12 brings the clock gating cell (CG000) 13 for supplying a clock to the flip-flop circuit (FF000) in the selected state and keeps the other clock gating cells 13 out of the selected state, whereby the image data is written to the flip-flop circuit (FF000) having the address 000.

On the contrary, in the case where the image data is read from the flip-flop circuits 11, for example, when an address of 000 is designated as the read address, then the read-address decoder 14 controls the selector 15 so as to output the image data written in the flip-flop circuit (FF000) having the address 000.

The line buffer of the address system is a circuit, which executes substantially the same operation as SRAM, which records the image data in the flip-flop circuit designated by use of the write address, and reads the image data from the flip-flop circuit designated by used of the read address.

FIG. 2 is a block diagram of the line buffer having 160 pixels on one line similar to as shown in FIG. 1, implemented in FIFO system.

In the line buffer of FIFO system shown in FIG. 2, a reference numeral 21 denotes a flop-flop block for storing entered image data, consisting of sequentially connected shift registers for storing 160 pixels.

In the line buffer of FIFO system shown in FIG. 2, a reference numeral 22 denotes a clock gating cell, which controls a clock supply to the whole flip-flop block 21, when data in the flip-flop block 21 consisting of the shift registers is shifted, and a reference numeral 23 denotes FIFO controlling unit for controlling shifting operation of the flip-flop block 21.

In the line buffer of FIFO system, in the case where image data of 160 pixels is stored in the line buffer, the image data of 160 pixels is sequentially entered from the leading pixel to the flip-flop block 21. The FIFO controlling unit 23 controls the clock gating cell 22 so as to supply a clock to the flip-flop block 21. When the clock is supplied to the whole flip-flop block 21 from the clock gating cell 22, then the flip-flop block 21 performs the shifting operation, whereby the image data of 160 pixels is stored in the flip-flop block 21.

In the case where image data is read from the flip-flop block 21, the FIFO controlling unit 23 controls the clock gating cell 22 so as to supply a clock to the flip-flop block 21. When the clock is supplied to the whole flip-flop block 21 from the clock gating cell 22, then the flip-flop block 21 performs the shifting operation, whereby the image data entered first is read first and thereafter the image data of 160 pixels is successively read from the flip-flop block 21.

SUMMARY OF THE INVENTION

According to one aspect of the invention, there is provided a semi-conductor storing apparatus, which comprises plural storing units, each having a line buffer including plural flip-flop circuits and a clock supplying circuit for supplying a clock to the plural flip-flop circuits, a clock-controlling unit, which controls on/off operation of the clock supplying circuit to decide whether to output a clock, a selecting unit, which selects one from among outputs from the plural storing units, and an unit-controlling unit, which controls the operations of the clock-controlling unit and the selecting unit.

DETAILED DESCRIPTION OF THE PREFERRED EMBODIMENTS

Now, an embodiment of the present invention which is applied to a line buffer whose one line stores 160 pixels will be described with reference to the accompanying drawings in detail.

Figure 1:
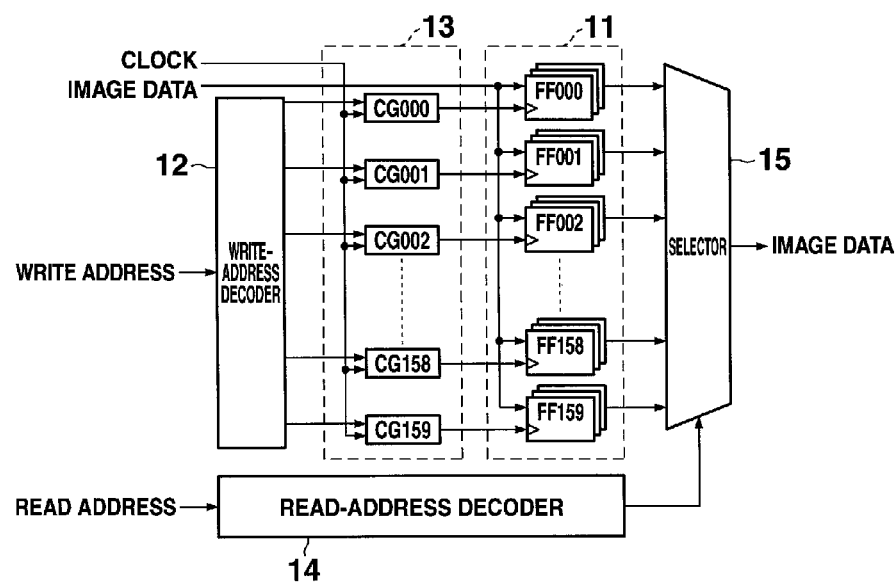
FIG. 1 is a block diagram of a line buffer having 160 pixels on one line, implemented in an address system.
Figure 2:
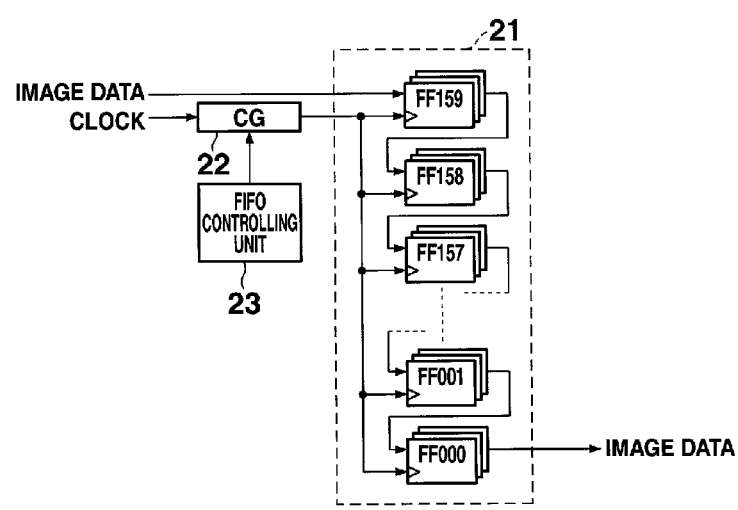
FIG. 2 is a block diagram of the line buffer having 160 pixels on one line similar to shown in FIG. 1, implemented in a FIFO system.
Figure 3:
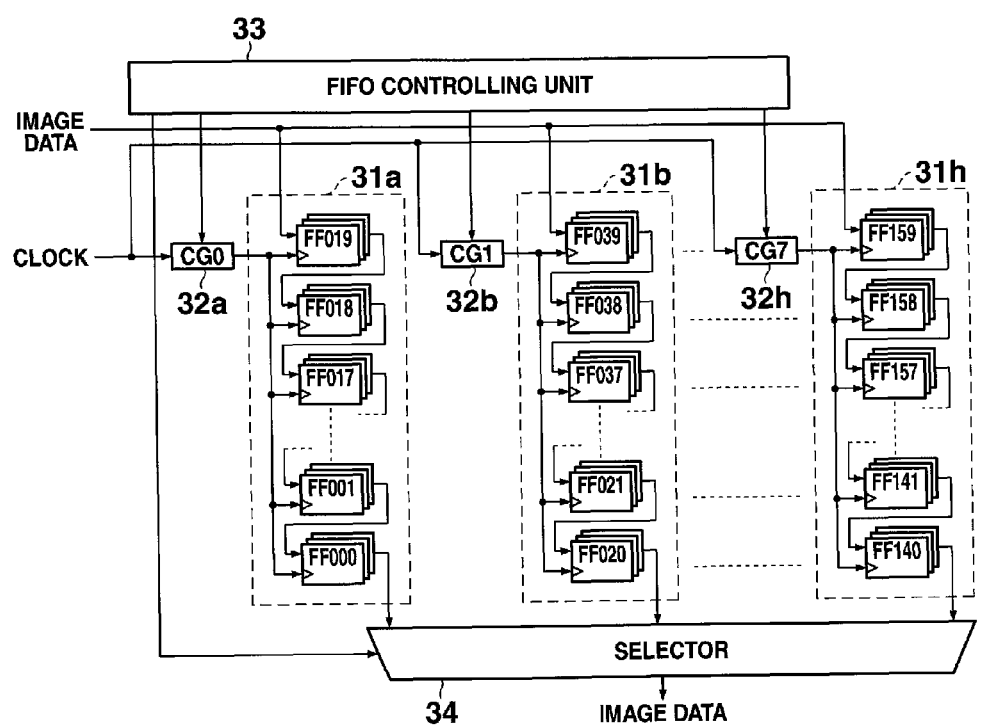
FIG. 3 is a block diagram of a line buffer whose one line stores 160 pixels, implemented in a FIFO-division system according to the present invention.

FIG. 3 is a block diagram of a line buffer whose one line stores 160 pixels according to the present invention.

The line buffer of the present invention is a line buffer of a FIFO-division system, in which the FIFO is divided into several blocks, each having some data storing capability. That is, the line buffer of a FIFO-division system according to the embodiment of the invention is provided with plural FIFOs, and a size of each FIFO corresponds to 20 pixels and 8 FIFOs are provided in total to store the image data of 160 pixels.

In the line buffer of a FIFO-division system shown in FIG. 3, reference numerals 31a to 31h denote flip-flop blocks for storing the entered image data, consisting of sequentially connected shift registers for every 20 pixels.

Further, in the line buffer of FIFO-division system shown in FIG. 3, reference numerals 32a to 32h denote clock gating cells, which control clock supplies to the flip-flop blocks 31a to 31h, when the image data is shifted in the flip-flop blocks 31a to 31h each consisting of the shift registers divided every 20 pixels. A reference numeral 33 denotes a FIFO controlling unit for controlling a shifting operation of each of the flip-flop blocks 31a to 31h, and a reference numeral 34 denotes a selector for selecting an output from the flip-flop block in shifting operation.

Hereinafter, the operation of the line buffer of a FIFO-division system shown in FIG. 3 will be described.

The image data is entered sequentially from the leading pixel to the 20th pixel into the flip-flop block 31a (FF019), and is stored in the flip-flop block 31a.

At this time, the FIFO controlling unit 33 controls the clock gating cell 32a so as to supply the clock to the flip-flop block 31a. When the clock is supplied to the flip-flop block 31a (all the flip-flop circuits 31a) from the clock gating cell 32a, then the flip-flop block 31a performs the shifting operation, whereby the image data of 20 pixels is stored in the flip-flop block 31a.

Further, the image data is entered sequentially from the 21st pixel to the 40th pixel into the flip-flop block 31b (FF039), and the image data from the 21st pixel to the 40th pixel is stored in the flip-flop block 31b.

At this time, the FIFO controlling unit 33 controls the clock gating cell 32b so as to supply the clock to the flip-flop block 31b. When the clock is supplied to the flip-flop block 31b (all the flip-flop circuits 31b) from the clock gating cell 32b, then the flip-flop block 31b performs the shifting operation, whereby the image data of the next 20 pixels is stored in the flip-flop block 31b.

Thereafter, the flip-flop blocks performing shifting operation are switched in a unit of 20 pixels, whereby the image data of 160 pixels is stored.

In the case of reading the image data, when the image data from the leading pixel to the 20th pixel is read, the FIFO controlling unit 33 controls the clock gating cell 32a so as to supply the clock to the flip-flop block 31a. When the clock is supplied to the whole flip-flop block 31a from the clock gating cell 32a, then the flip-flop block 31a performs the shifting operation, whereby the image data is sequentially output in the order of from the leading pixel to the 20th pixel. Further, the FIFO controlling unit 33 controls the selector 34 so as to select the output of the flip-flop block 31a.

Further, when the image data from the 21st pixel to the 40th pixel is read, the FIFO controlling unit 33 controls the clock gating cell 32b so as to supply the clock to the flip-flop block 31b. When the clock is supplied to the whole flip-flop block 31b from the clock gating cell 32b, then the flip-flop block 31b performs the shifting operation, whereby the image data is sequentially output in the order of from the 21st pixel to the 40th pixel. Further, the FIFO controlling unit 33 controls the selector 34 so as to select the output of the flip-flop block 31b.

Thereafter, the flip-flop blocks performing shifting operation are switched in a unit of 20 pixels, whereby the image data of 160 pixels is sequentially output.

As described above, in the line buffer of a FIFO-division system of the present invention, the FIFO is divided into several blocks. In other words, in the semi-conductor storing apparatus of the present invention, the smaller number of flip-flop circuits performing the shifting operation can store the data of the same volume as the line buffer of the conventional FIFO system stores, and therefore, the present semiconductor storing apparatus can manage to reduce power consumption.

The selector, that is, a selecting circuit provided in the output stage selects the output only from the several divided FIFOs. Therefore, the selector needs a less circuit area than the conventional line buffer of an address system. As described above, the conventional line buffer of the address system is provided with the write address decoder, the read address decoder, and the selector, which uses a large circuit area.

In the present embodiment of the invention, the line buffer of a FIFO-division system is provided with 8 FIFOs, and therefore, the selector or the selecting circuit provided in the output stage is only required to select one FIFO out of the 8 FIFOs. On the contrary, the selector in the conventional line buffer of an address system has to select one flip-flop circuit out of 160 flip-flop circuits.

Figure 4:
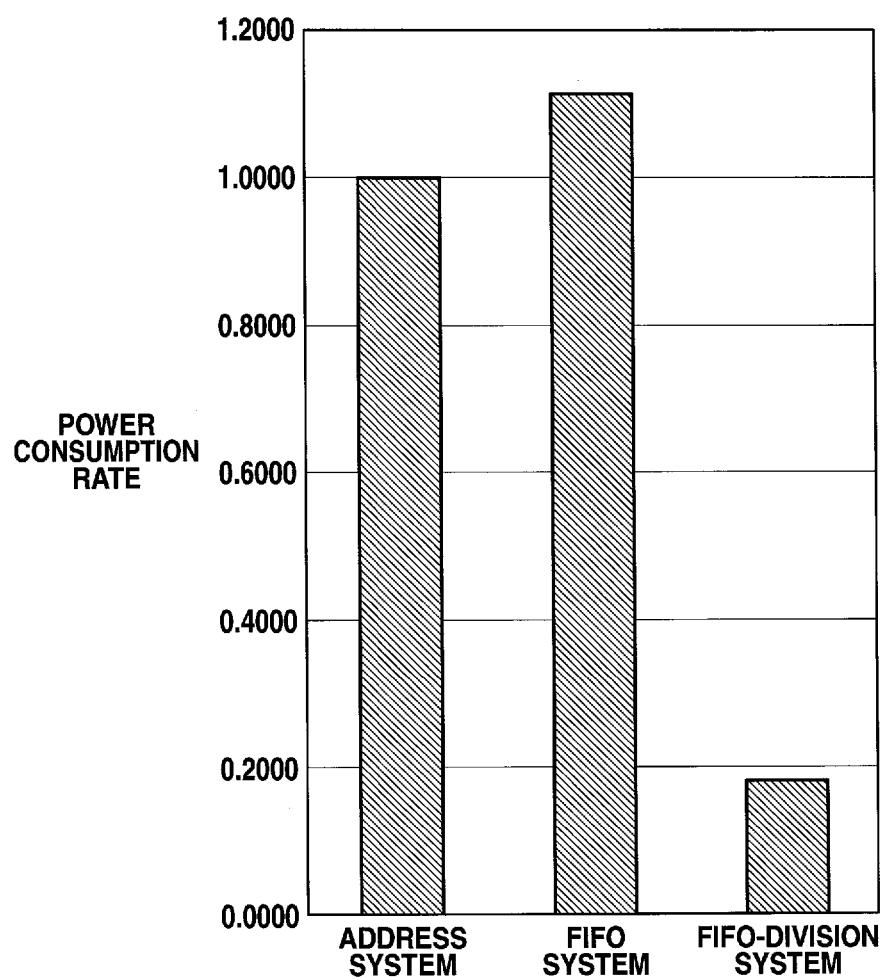
FIG. 4 is a view showing differences in power consumption between the line buffer of an address system, the line buffer of a FIFO system, and the line buffer of a FIFO-division system of the present invention.

FIG. 4 is a view showing differences in power consumption between the line buffer of an address system, the line buffer of a FIFO system, and the line buffer of a FIFO-division system of the present invention.

As shown in FIG. 4, it will be understood that the line buffer of a FIFO-division system of the present invention can reduce the power consumption to one fifth or less of the conventional line buffer of an address system or of a FIFO system.

Figure 5:
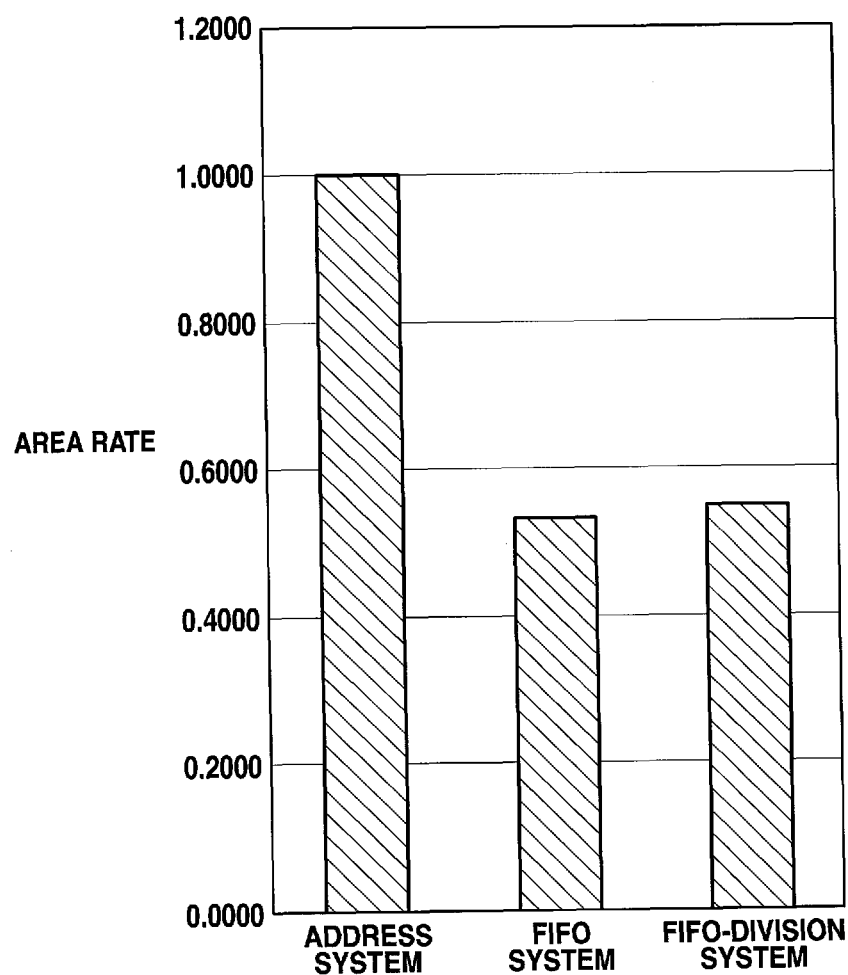
FIG. 5 is a view showing differences in circuit areas used between the line buffer of an address system, the line buffer of a FIFO system, and the line buffer of a FIFO-division system of the present invention.

FIG. 5 is a view showing differences in circuit area between the line buffer of an address system, the line buffer of a FIFO system, and the line buffer of a FIFO-division system of the present invention.

As shown in FIG. 5, it will be understood that the line buffer of a FIFO-division system of the present invention can be mounted within the area of the conventional line buffer of a FIFO system, but only needs about half of the area used by the line buffer of an address system.

The line buffer of a FIFO-division system of the present invention can optimize in circuit area and power consumption compared to the conventional line buffers of a FIFO system and/or of an address system.

Although specific circuit configurations of the invention have been described in the foregoing detailed description, it will be understood that the invention is not limited to the particular embodiments described herein, but modifications and rearrangements may be made to the disclosed embodiments while remaining within the scope of the invention as defined by the following claims. It is intended to include all such modifications and rearrangements in the following claims and their equivalents.

What is claimed is:

1. A semi-conductor storing apparatus comprising:
    plural storing units, each having a line buffer including plural flip-flop circuits and a clock supplying circuit for supplying a clock to the plural flip-flop circuits;
    a clock-controlling unit, which controls on/off operation of the clock supplying circuit to decide whether to output a clock;
    a selecting unit, which selects one from among outputs from the plural storing units; and
    an unit-controlling unit, which controls the operations of the clock-controlling unit and the selecting unit.

2. The semi-conductor storing apparatus according to 1, wherein
    the unit-controlling unit controls the clock supplying circuit in the storing-unit performing a writing operation among the plural storing units so as to output a clock, when data is written in the semi-conductor storing apparatus.

3. The semi-conductor storing apparatus according to 1, wherein
    the unit-controlling unit controls the clock supplying circuit in the storing-unit performing a reading operation among the plural storing units so as to output a clock and also controls the selecting unit so as to select the output of the storing unit whose clock supplying unit controlled by the clock-controlling unit to output a clock, when data is read from the semi-conductor storing apparatus.

4. The semi-conductor storing apparatus according to 1, wherein
    the line buffer is configured in FIFO (First-In First-Out) system.

5. A data accessing method in a semi-conductor storing apparatus, which is provided with plural line buffers, each having plural flip-flop circuits, comprising:
    a step of supplying a clock to the plural flip-flop circuits in one of the plural line buffers; and
    a step of selecting output data from the line buffer whose flip-flop circuits are supplied with the clock.

* * * * *